(12) United States Patent
Yun et al.

(10) Patent No.: US 8,021,512 B2
(45) Date of Patent: *Sep. 20, 2011

(54) METHOD OF PREVENTING PREMATURE DRYING

(75) Inventors: Seokmin Yun, Pleasanton, CA (US); Mark Wilcoxson, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 721 days.

This patent is subject to a terminal disclaimer.

(21) Appl. No.: 11/803,501

(22) Filed: May 14, 2007

(65) Prior Publication Data

US 2009/0246372 A1    Oct. 1, 2009

(51) Int. Cl.
   *H01L 21/304*  (2006.01)
   *H01L 21/02*   (2006.01)
   *B08B 3/08*    (2006.01)

(52) U.S. Cl. .................. 156/345.22; 118/718

(58) Field of Classification Search ............ 118/718; 156/345.22
   See application file for complete search history.

(56) References Cited

U.S. PATENT DOCUMENTS

| | | | |
|---|---|---|---|
| 6,883,248 B2 | 4/2005 | Ko et al. | |
| 7,383,601 B2 * | 6/2008 | Ravkin et al. | 15/77 |
| 7,520,284 B2 * | 4/2009 | Boyd et al. | 134/57 R |
| 2005/0132515 A1 * | 6/2005 | Boyd et al. | 15/77 |
| 2006/0086373 A1 | 4/2006 | Park | |
| 2008/0148595 A1 * | 6/2008 | de Larios et al. | 34/448 |
| 2009/0211596 A1 * | 8/2009 | Yun et al. | 134/6 |
| 2009/0246372 A1 * | 10/2009 | Yun et al. | 427/255.7 |
| 2010/0015731 A1 * | 1/2010 | Yun et al. | 438/4 |

FOREIGN PATENT DOCUMENTS

| | | |
|---|---|---|
| JP | 11-344286 A | 12/1999 |
| KR | 10-2004-0110508 A | 12/2004 |

OTHER PUBLICATIONS

PCT International Search Report—PCT/US2008/005950, Aug. 28, 2008, (3) pages.

* cited by examiner

*Primary Examiner* — Sylvia R. MacArthur
(74) *Attorney, Agent, or Firm* — Martine Penilla & Gencarella, LLP

(57) ABSTRACT

An apparatus, system and method for preventing premature drying of a surface of a substrate between fabrication operations includes receiving a substrate for cleaning, performing wet cleaning operations to the surface of the substrate to remove contaminants and fabrication chemistries left behind during one or more fabrication operations from the surface of the substrate, identifying a saturated gas chemistry and applying the identified saturated gas chemistry in a transition region such that the surface of the substrate exposed to the saturated gas chemistry in the transition region retains the moisture thereby preventing the surface of the substrate from premature drying. The saturated gas chemistry is applied between two subsequent wet-cleaning operations.

18 Claims, 6 Drawing Sheets

METHOD OF PREVENTING PREMATURE DRYING

FIELD OF THE INVENTION

The present invention relates generally to semiconductor substrate processing, and more particularly, to an improved technique for preventing premature drying of the semiconductor substrate between wet chemical treatments during fabrication operations.

DESCRIPTION OF THE RELATED ART

Producing a substantially defect-free semiconductor substrate is an ongoing challenge during a fabrication process. Various operations in the fabrication process, such as polysilicon etching, photoresist stripping, metal depositing, use chemical treatment to define features and structures on the substrate, resulting in operable integrated circuits and other microelectronic devices. After each chemical treatment, it is required to perform one or more cleaning operations to remove the contaminants and treatment chemicals from the surface of the substrate. Various cleaning operations, including wet cleaning, are widely well-known and commonly used in the semiconductor chip manufacturing. Some of the wet cleaning processes that are used for cleaning the surface of the substrate include immersing the substrate in a chemical container or tank containing a wet cleaning chemical, spraying wet cleaning chemicals on the surface of the substrate or applying chemicals to the surface of a spinning substrate.

Usually, a combination of more than one wet cleaning process needs to be performed for an effective clean of the surface of the substrate in preparation for subsequent fabrication operations. During the wet cleaning process, the substrate may be moved from one chemical soak to another chemical soak. In order to perform effective cleaning and to maximize recollection of chemicals, it is desirable to keep these chemical soaks isolated from one another. As a result, when the substrate is moved from one chemical soak to another, premature drying of the substrate may occur. It is essential to prevent premature drying as the premature drying may cause spotting. Spotting is undesirable in the fabrication process as it may attract dirt, interfere with subsequent fabrication processing and/or produce undesirable effects on the underlying features of the substrate.

In view of the foregoing, there is a need for an effective method and apparatus for preventing premature drying so that functionality of the resulting IC chips may be preserved and to ensure subsequent fabrication operations can be performed on the substrate.

SUMMARY

The present invention fills the need by providing an improved method and apparatus for preventing premature drying of the substrate. It should be appreciated that the present invention can be implemented in numerous ways, including as an apparatus and a method. Several inventive embodiments of the present invention are described below.

In one embodiment, an apparatus for preventing premature drying of a surface of a substrate between fabrication operations during a fabrication process is disclosed. The apparatus includes a substrate supporting device to receive and support the substrate and a gas chemistry applicator configured to receive and apply a saturated gas chemistry to the surface of the substrate. The applied saturated gas chemistry is substantially contained in a transition region wherein the surface of the substrate is exposed to ambient air. The application of the saturated gas chemistry provides an isotropic exposure of the saturated gas chemistry in the transition region so that the surface of the substrate exposed to the saturated gas chemistry maintains the moisture on the surface of the substrate preventing the surface of the substrate from premature drying.

In another embodiment of the invention, a system for preventing premature drying of a surface of a substrate between fabrication operations is disclosed. The system includes a substrate supporting device to receive and support the substrate in an ambient controlled chamber and a proximity head system disposed within the ambient controlled chamber. The substrate supporting device is configured to receive and move the substrate along a plane and to rotate the substrate along an axis of rotation within the ambient controlled chamber. The proximity head system includes a plurality of proximity heads. Each of the plurality of proximity heads is used to apply one or more liquid cleaning chemistry menisci between the surface of the substrate and an opposing surface of the proximity head. The liquid cleaning chemistry menisci substantially remove residues and chemicals left behind from other fabrication operations. The ambient controlled chamber further includes one or more nozzles to introduce a saturated gas chemistry to a transition region in the chamber. The surface of the substrate in transit between the proximity heads is exposed to the saturated gas chemistry in the transition region. The exposure to the saturated gas chemistry helps in preserving the moisture on the surface of the substrate preventing the surface of the substrate from premature drying. In an alternate embodiment of the invention, a brush device system is used within the ambient controlled chamber to apply liquid cleaning chemistry to the surface of the substrate instead of a proximity head system.

In another embodiment of the invention, a method for preventing premature drying of a surface of a substrate between fabrication operations is disclosed. The method includes receiving a substrate for cleaning, performing wet cleaning operations to the surface of the substrate to remove contaminants and fabrication chemistries left behind during one or more fabrication operations from the surface of the substrate, identifying a saturated gas chemistry and applying the identified saturated gas chemistry in a transition region. The transition region is defined as a region where the surface of the substrate is exposed to ambient air. The identified saturated gas chemistry is applied in the transition region such that the surface of the substrate exposed to the saturated gas chemistry in the transition region retains the moisture thereby preventing the surface of the substrate from premature drying. The saturated gas chemistry is applied between two subsequent wet-cleaning operations.

Other aspects and advantages of the invention will become more apparent from the following detailed description, taken in conjunction with the accompanying drawings, illustrating by way of example the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

DETAILED DESCRIPTION

Several embodiments for effectively preventing premature drying of the surface of the substrate between two wet cleaning operations will now be described. It will be obvious, however, to one skilled in the art, that the present invention may be practiced without some or all of these specific details. In other instances, well known process operations have not been described in detail in order not to unnecessarily obscure the present invention.

With the current trend of packing more and more features and structures on to the substrate, it is crucial to keep the surface of the substrate as clean and error-free as possible. This includes avoiding premature drying by keeping the surface of the substrate moist between wet cleaning operations. Premature drying may cause spots to form on the surface of the substrate. These spots may attract impurities, interfere with subsequent fabrication processing and cause undesirable effects on the underlying features. The moistness on the surface of the substrate may be maintained by treating the exposed surface of the substrate with saturated gas chemistry. The saturated gas chemistry aids in retaining the moisture on the surface of the substrate, thereby preventing spotting due to premature drying.

The saturated gas chemistry is applied to the surface of a substrate in a controlled manner in a transition region exposed to ambient air so that the surface of the substrate exposed to the saturated gas chemistry in the transition region is able to retain the moistness on the substrate surface. Careful treatment of the saturated gas chemistry to the surface of the substrate enables preserving the quality of the features formed on the substrate and the resulting semiconductor products, e.g., microchips.

Figure 1A:
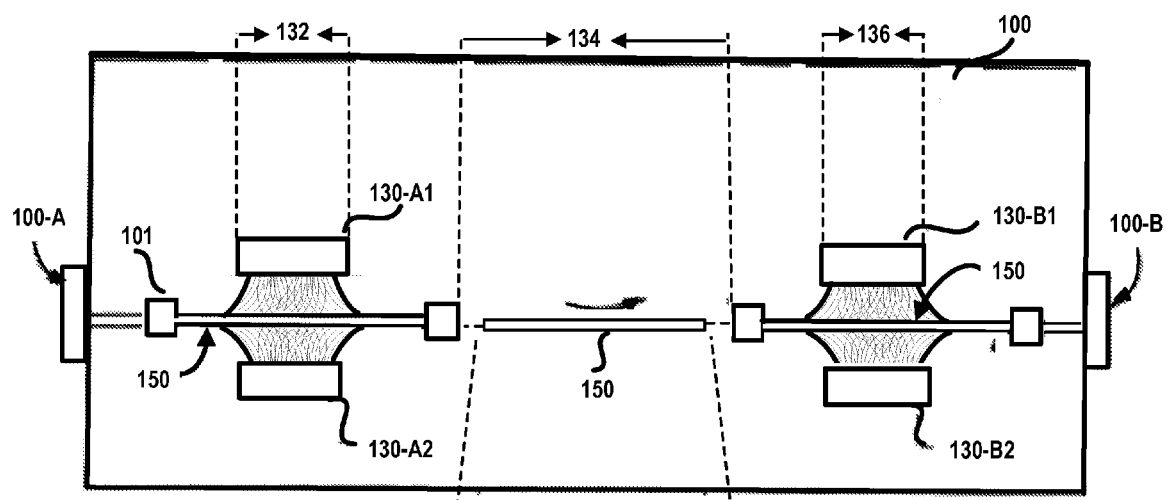
FIG. 1A is a simplified schematic diagram of an ambient controlled chamber in which a substrate is received and cleaned.

FIG. 1A is a simplified cross-section view of a system with an ambient controlled chamber 100, such as an advanced mechanical clean (AMC) chamber, in which a substrate is received and cleaned, in one embodiment of the invention. The ambient controlled chamber 100, also called a housing chamber, is a chamber in which a plurality of fabrication operations is performed on a substrate in a controlled ambient atmosphere. For more information on the AMC chamber and how the AMC chamber is used in the fabrication process, reference may be made to U.S. patent application Ser. No. 10/608,871 and U.S. Patent Publication No. 2006/0128600.

The housing chamber 100 employs a plurality of proximity heads, 130-A1, 130-A2, 130-B1, and 130-B2, to apply one or more liquid cleaning chemistry as liquid meniscus to a surface of a substrate 150. The proximity heads shown in this embodiment are dual proximity heads positioned on either side of a treatment region through which a substrate 150 moves in the housing chamber 100. Variations on the number of proximity heads and their position with respect to the treatment region may be employed. The substrate 150 is introduced into the housing chamber 100 at one end of the treatment region through an entry port 100-A, moved through the treatment region and removed from the housing chamber 100 at the other end of the treatment region through an exit port 100-B.

The term, "meniscus", as used herein with reference to wet (liquid) cleaning chemistry, refers to a volume of liquid chemistry bounded and contained in part by surface tension of the liquid chemistry between the opposing surface of a proximity head 130 and a surface of the substrate 150. The meniscus thus formed, is also controllable and can be moved over a surface in the contained shape and is used to remove the contaminants from the surface of the substrate 150. In specific embodiments, the meniscus shape can be controlled by precision liquid chemistry delivery and removal systems that may further include a computer (computing system).

For more information on the formation of a meniscus and the application to the surface of a substrate 150, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,988,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,988,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the subject application, and each is incorporated herein by reference. For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent application, which is assigned to Lam Research Corporation, the assignee of the subject application, is incorporated herein by reference.

As described herein, a proximity head 130 is a substrate treatment apparatus that can deliver precise volume of a chemistry to a surface of a substrate 150 to be treated, and remove the chemistry from the surface, when the proximity head 130 is placed in close relation to the surface of the substrate 150. In one example, the proximity head 130 has an opposing head surface (opposing surface) and the opposing surface is placed substantially parallel to the surface of the substrate 150. A meniscus is formed between the opposing surface and the surface of the substrate 150. The proximity head 130 may also be configured to deliver a plurality of chemistry, and are configured with vacuum ports for removing the plurality of chemistry that were delivered.

By controlling the delivery and removal of the chemistry to the meniscus, the meniscus can be controlled and moved over the surface of the substrate 150. In some embodiments, the substrate 150 can be moved, while the proximity head 130 is still, and in other embodiments, the proximity head 130 moves and the substrate 150 remains still, during the processing period. Further, for completeness, it should be understood that the processing can occur in any orientation, and as such, the meniscus can be applied to surfaces that are not horizontal (e.g., vertical substrates or substrates that are held at an angle).

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent application, which is assigned to Lam Research Corporation, the assignee of the subject application, is incorporated herein by reference.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. patent, which is assigned to Lam Research Corporation, the assignee of the subject application, is incorporated herein by reference.

Referring to FIG. 1A, a substrate supporting device, to receive the substrate 150 at the entry port and to transport the substrate 150 along a plane and to deliver the substrate 150 at the exit port 100-B, is provided. The substrate supporting device may be a carrier 101 having an inset to receive and hold the substrate 150. The carrier 101 is positioned in the treatment region and includes pins/rollers (not shown) to receive and hold the substrate 100 along a plane and motors to move the substrate along the plane. The carrier 101 may also be configured to rotate the substrate 150 along an axis of rotation while being transported through the housing chamber 100 so that the surface of the substrate 150 is substantially exposed to the various chemistries applied.

The treatment region includes a plurality of treatment sub-regions 132, 136 where one or more liquid cleaning chemistry are applied as liquid meniscus/menisci to the surface of the substrate using a plurality of proximity heads 130-A1, 130-A2, 130-B1, 130-B2, and a transition region 134 where the substrate is exposed to ambient air while being transported from treatment sub-region 132 to treatment sub-region 136.

Figure 1B:
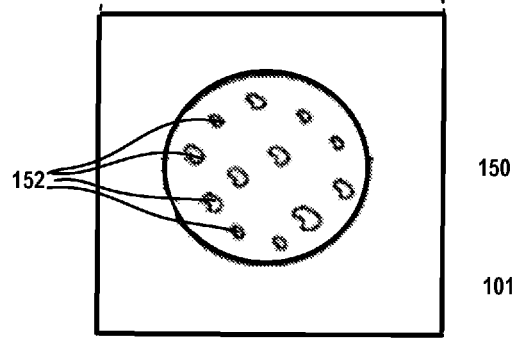
FIG. 1B illustrates a surface of a substrate with spots, in one embodiment of the invention.

FIG. 1B illustrates the surface of the substrate 150 in a transition region 134. As the substrate is transported from one treatment sub-region (132) to the next (136) within the ambient controlled chamber 100, the surface of the substrate, exposed to the ambient air in the transition region 134, experiences premature drying. The premature drying results in spots 152 to form randomly on the surface of the substrate. As mentioned earlier, these spots 152 can have condensed impurities as liquid evaporates and causes undesirable results during subsequent fabrication operations and to the underlying features and structures.

Figure 2:
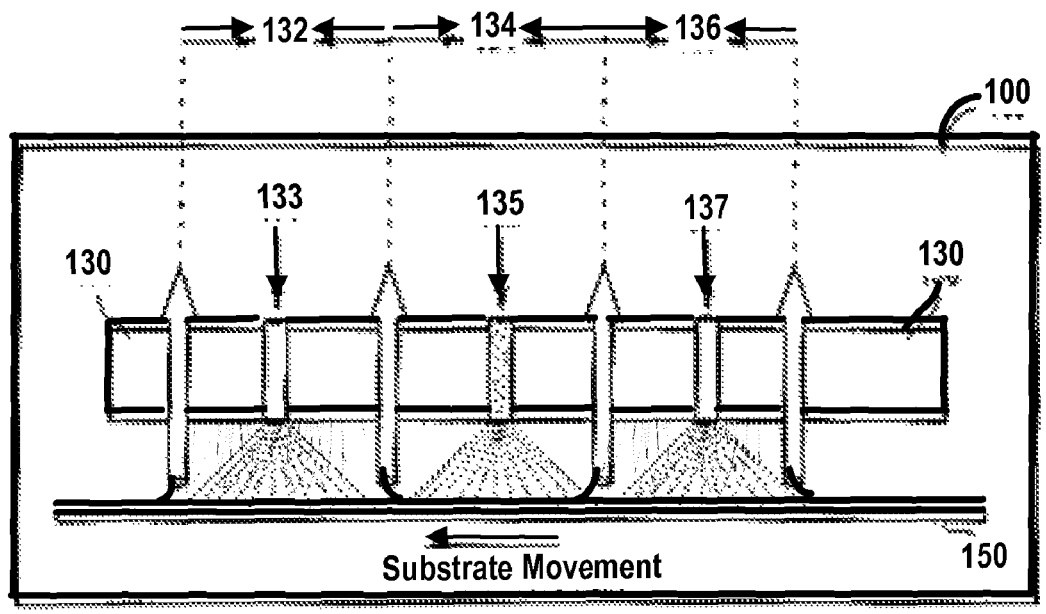
FIG. 2 is a cross-section view of an apparatus using proximity head to apply gas chemistry in the transition region, in one embodiment of the invention.

FIG. 2 illustrates a system in one embodiment of the invention, wherein a saturated gas chemistry is introduced in a transition region 134 of a treatment region. In this embodiment, as the substrate 150 is transported in the treatment region, the surface of the substrate 150 exposed to the ambient air in the transition region 134 is treated with the saturated gas chemistry. The system includes an ambient controlled chamber 100 with a proximity head 130 to provide one or more liquid cleaning chemistry menisci to the surface of the substrate 150. The proximity head 130 includes a distinct portion to apply cleaning chemistry 1 and a distinct portion to apply cleaning chemistry 2. The cleaning chemistries 1 and 2 are liquid cleaning chemistries that are received into a reservoir and supplied to the substrate as liquid menisci. The cleaning chemistry 1 is applied to a portion of the surface of the substrate, identified as treatment sub-region 132, as a liquid meniscus through a first inlet 133 and cleaning chemistry 2 is applied to another distinct portion of the surface of the substrate, identified as treatment sub-region 136, as a liquid meniscus through a second inlet 137. In an alternate embodiment, instead of a single proximity head a plurality of proximity heads 130-A, 130-B may be used to apply the cleaning chemistries 1 and 2 as the substrate is moved through the treatment region. An inlet-control at each of the first and second inlets (133, 137) controls the application of the liquid menisci of the cleaning chemistries 1 and 2. A gas chemistry applicator introduces a saturated gas chemistry into the housing chamber 100 through at least one nozzle 135 such that the saturated gas chemistry is substantially contained within a transition region 134 of the treatment region. The application of the saturated gas chemistry in the transition region 134 is controlled so that the surface of the substrate 100 is isotropically (i.e., uniformly in direction) exposed to the saturated gas chemistry in the transition region 134. The nozzle 135 includes a nozzle-control to control the flow of the saturated gas chemistry into the housing chamber 100.

The system can be employed to apply a variation of chemistries and saturated gas chemistry to the substrate 150. In one embodiment, the system may be used to apply a liquid cleaning chemistry, a saturated gas chemistry and a fabrication chemistry. In another embodiment, the system may be used to apply a first liquid cleaning chemistry, a saturated gas chemistry and a second liquid cleaning chemistry. The system can also be engaged in applying a saturated gas chemistry in between two fabrication chemistries.

The application of liquid cleaning chemistry menisci and saturated gas chemistry to the surface of the substrate 150 may be controlled based on an analysis of the fabrication chemistries used, residues left behind by one or more fabrication operations, the extent of cleaning that needs to be performed and the type of layers formed on the surface of the substrate 150. The inlet-controls, that control the flow of the liquid cleaning chemistries, and the nozzle-control, that controls the flow of the saturated gas chemistry into the ambient controlled chamber, together constitute a delivery control mechanism. The delivery control mechanism may be communicatively connected to a computer (computing system) running a software that adjusts the controls of the inlet-controls and the nozzle-control so that the cleaning chemistries and the saturated gas chemistry may be applied to the surface of the substrate 150 in the housing chamber 100 in a controlled manner. The computer may be positioned anywhere so long as it is communicatively connected to the delivery control mechanism within the housing chamber 100. The computer provides a control recipe for the liquid cleaning chemistry and saturated gas chemistry so that the cleaning chemistries and saturated gas chemistry are applied appropriately to surface of the substrate to obtain optimal cleaning result. The control recipe includes various parameters associated with the liquid cleaning chemistry and the saturated gas chemistry. Some of the parameters that may be considered in providing the control recipe include type of liquid cleaning chemistry or saturated gas chemistry to be used, flow rate, concentration of the chemistry, temperature of the chemistry and time of exposure.

Figure 3:
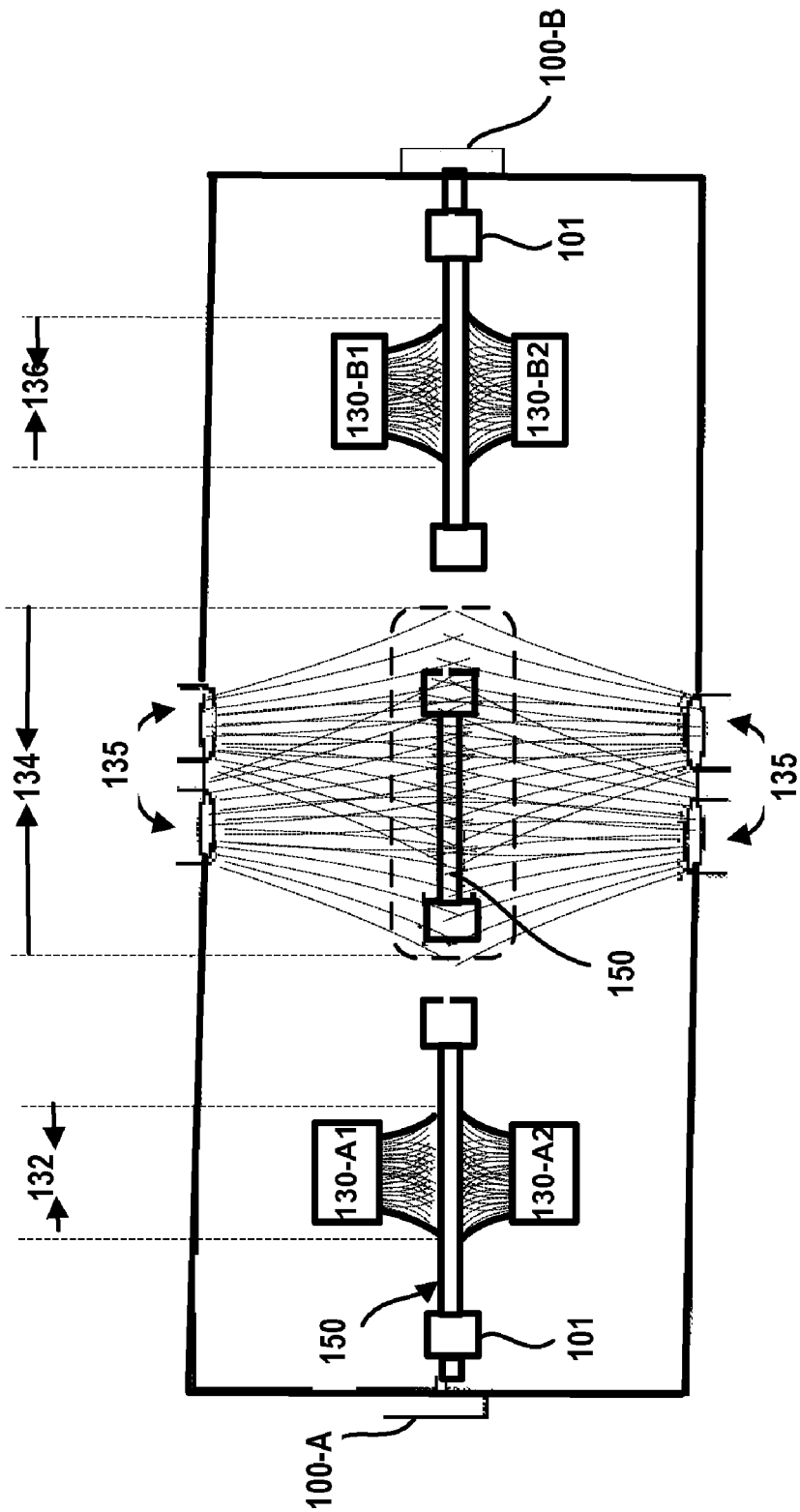
FIG. 3 is a schematic diagram of an advanced mechanical clean chamber used to apply saturated gas chemistry to the substrate, in one embodiment of the invention.

FIG. 3 illustrates a variation of the system illustrated in FIG. 2. The system in FIG. 3 employs a plurality of dual proximity heads. The dual proximity heads are positioned on either side of the treatment region within the housing chamber 100 and are configured to apply a plurality of cleaning chemistries to the top and bottom surfaces of the substrate 150 when the substrate is in the appropriate treatment sub-regions (132, 136). A plurality of inlets 135 in the housing chamber 100 allow the saturated gas chemistry to be applied and substantially contained in the transition region 134. As the surface of the substrate 150 moves along a plane within the housing chamber 100, both sides of the substrate 150 are exposed to the saturated gas chemistry in the transition region 134. The saturated gas chemistry aids in retaining the moisture on the surface of the substrate preventing the surface from premature drying.

Figure 4A:
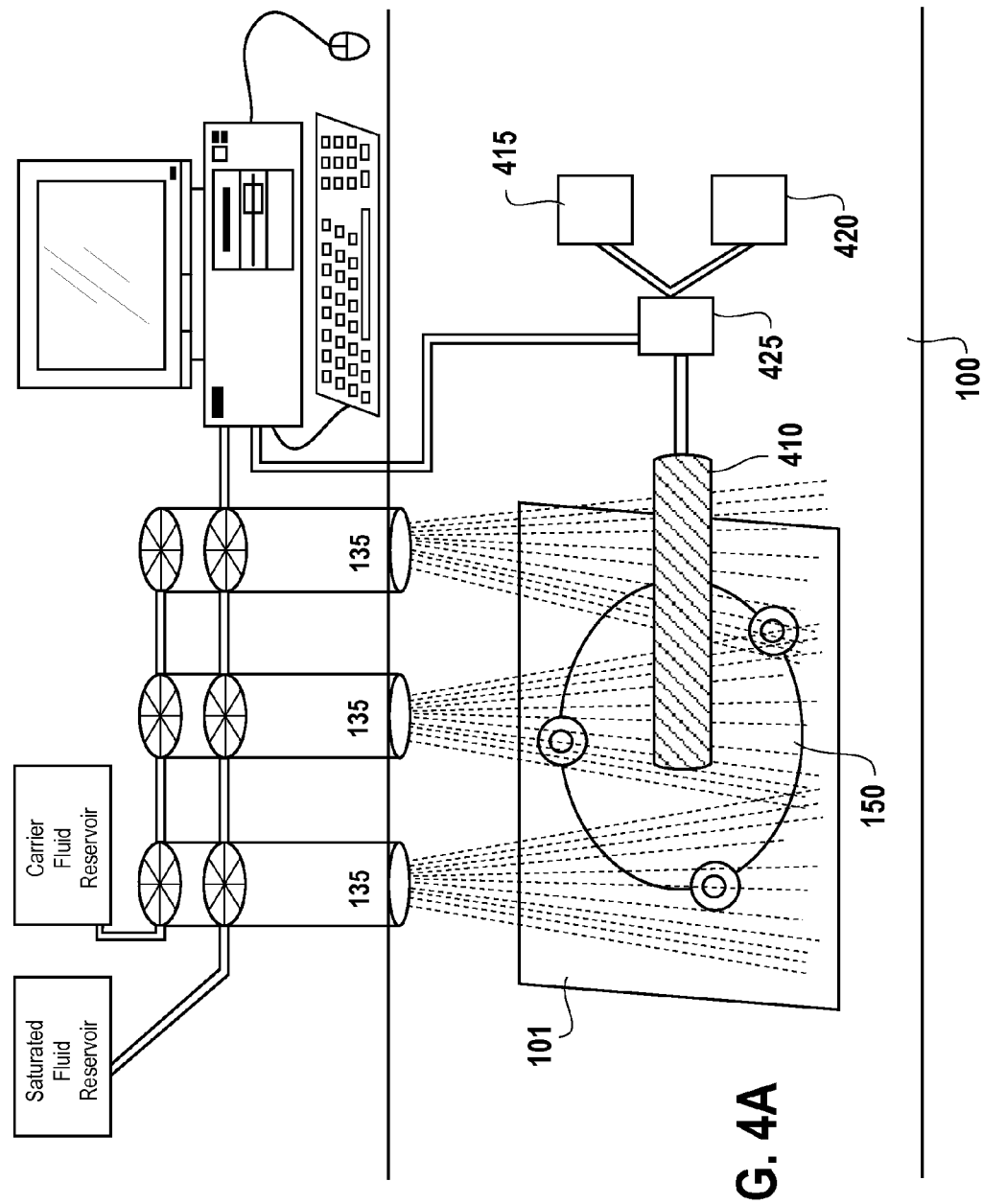
FIG. 4A is an alternate embodiment illustrated in FIG. 3 that is used to treat saturated gas chemistry.

In an alternate embodiment of the invention illustrated in FIG. 4A, a brush device system is used instead of a proximity head system to apply liquid cleaning chemistry to the surface of the substrate 150. In this embodiment, the substrate supporting device 101 disposed in a treatment region within the housing chamber 100 is configured to receive and support the substrate in the treatment region within the housing chamber 100 and rotate the substrate along an axis of rotation so that different portions of the substrate are exposed to the chemistry applied during the cleaning process. The brush device system includes a brush that is configured to receive and apply one or more cleaning chemistries to the surface of the substrate 150. A first liquid cleaning chemistry, chemistry A, is identified and introduced into the brush through an inlet-control 425. The inlet-control 425 controls the amount of chemistry A to be supplied to the brush. A reservoir 415 configured to receive and supply chemistry A to the brush as and when required, is provided. The parameters associated with the liquid cleaning chemistry are adjusted so that appropriate amount of chemistry A is introduced to the brush for effective cleaning of the surface of the substrate 150. The brush device system and the substrate supporting device are configured to allow the substrate to move relative to the brush so that the different portions of the surface of the substrate are substantially exposed to the liquid cleaning chemistry during a cleaning operation.

The brush in the brush device system is also configured to introduce a second liquid cleaning chemistry, chemistry B, to further clean the surface of the substrate 150. The second liquid cleaning chemistry, chemistry B, is identified and introduced into the brush using an inlet-control 425. A second reservoir 420 is configured to receive and supply chemistry B to the brush as and when required. The inlet-control 425 is configured to control the amount of liquid cleaning chemistry, chemistry A or chemistry B, introduced into the brush and to switch from one liquid cleaning chemistry to another as and when required. For example, chemistry A is supplied to the brush for a set period of time. After the set period of time expires, the inlet-control 425 switches off the supply of chemistry A to the brush and switches on the supply of chemistry B, so that chemistry B is introduced into the brush. Chemistry B is then applied for another set period of time.

During the switching from one chemistry to another, the substrate exposed to ambient air in the housing chamber 100 may experience premature drying. In order to avoid the premature drying, the surface of the substrate 150 is treated to a saturated gas chemistry introduced into the housing chamber 100 during the switching operation. To facilitate the introduction of the saturated gas chemistry, the housing chamber 100 includes one or more nozzles 135 with a nozzle-control configured to control the introduction of the saturated gas chemistry into the housing chamber 100 such that the saturated gas chemistry is substantially contained in a transition region 134 of the treatment region. The surface of the substrate is substantially exposed to the saturated gas chemistry during switching time. In one embodiment of the invention, a gas chemistry such as nitrogen, argon, neon or oxygen is received into a reservoir and mixed with de-ionized water to yield a saturated gas chemistry which is then introduced into the housing chamber 100 through a nozzle 135 using a nozzle-control. In another embodiment, the saturated gas chemistry is received into the reservoir and introduced into the housing chamber 100. The nozzle-control and inlet-control 425 together constitute a control delivery mechanism. The control delivery mechanism is communicatively connected to a computing system (computer) that provides a control recipe for the application of the liquid cleaning chemistry and saturated gas chemistry. The control recipe includes a plurality of parameters associated with the liquid cleaning chemistry and saturated gas chemistry that are used when applying the liquid cleaning chemistry and saturated gas chemistry to the surface of the substrate 150.

The gas or gases defining a gas portion of the saturated gas chemistry can be either inert, e.g., nitrogen ($N_2$), argon (Ar), neon (Ne), etc., or reactive, e.g., oxygen ($O_2$), etc. In one embodiment, the gas portion includes only a single type of gas, for example, nitrogen ($N_2$). In another embodiment, the gas portion is a gas mixture that includes mixtures of various types of gases, such as: nitrogen (N2), and argon (Ar); argon (Ar), oxygen ($O_2$) and nitrogen ($N_2$); oxygen ($O_2$) and argon (Ar). It should be appreciated that the gas portion can include essentially any combination of gas types as long as the resulting gas mixture can be combined with a liquid portion and applied to the surface of the substrate to prevent premature drying. The liquid component of the saturated gas chemistry, being a continuous medium, is one of de-ionized (DI) water, a base fluid, or mixtures of DI water and chemicals. The saturated gas chemistry and cleaning chemistries are chosen such that the saturated gas chemistry is substantially immiscible in the cleaning chemistries.

Figure 4B:
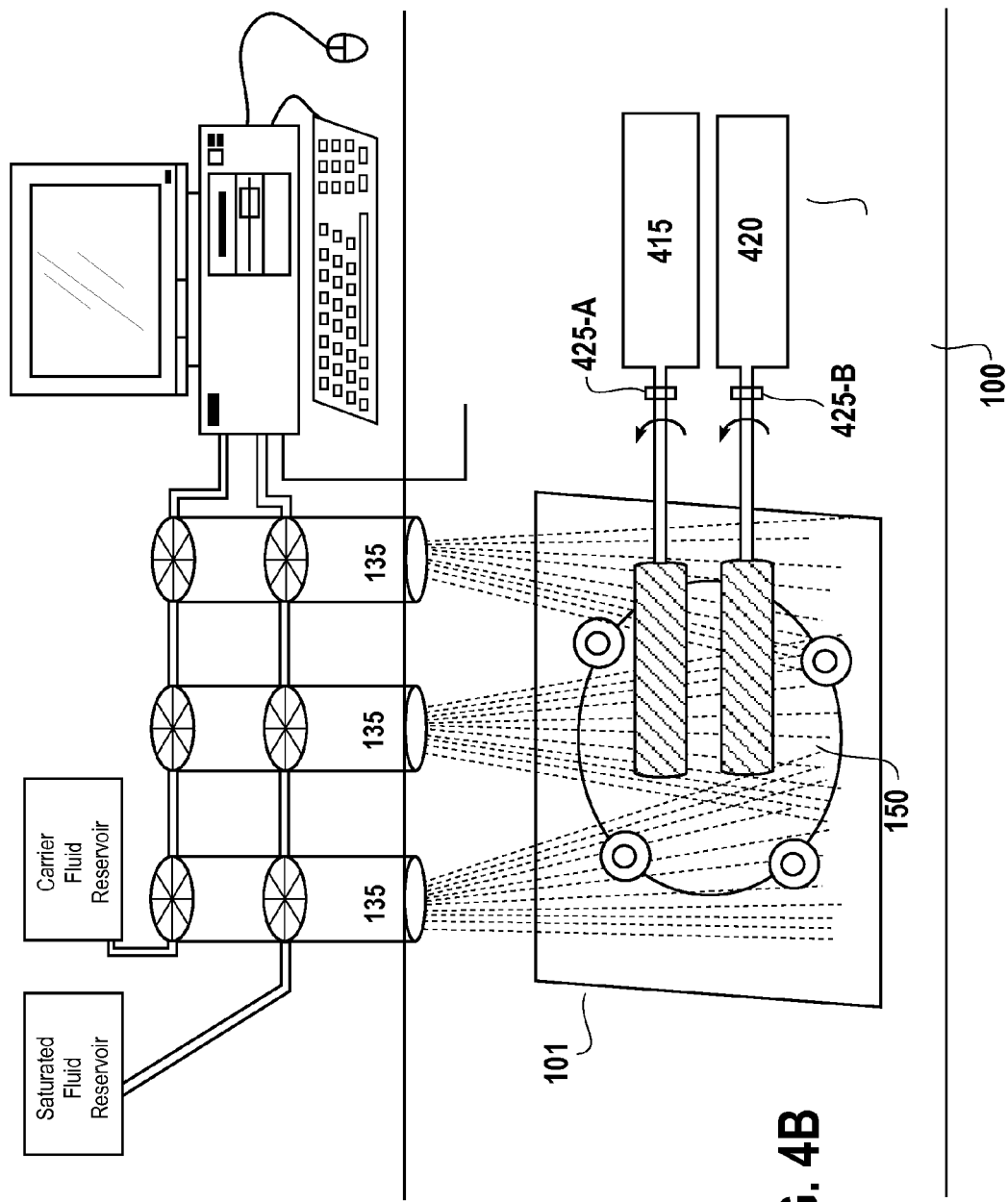
FIG. 4B is an alternate embodiment illustrated in FIGS. 3 and 4A.

In an alternate embodiment illustrated in FIG. 4B, the brush device system includes a first brush to introduce chemistry A and a second brush to introduce chemistry B. In this embodiment, a first inlet-control 425-A controls the flow of chemistry A from a first reservoir 415 to the first brush and a second inlet-control 425-B controls the flow of chemistry B from a second reservoir 420 to the second brush. The surface of the substrate 150 is first treated with chemistry A for a pre-set period of time. The supply of chemistry A is shut off after the pre-set period of time and supply of chemistry B is turned on for another pre-set period of time. During the time between switching from chemistry A to chemistry B, the surface of the substrate is treated with saturated gas chemistry so that the surface of the substrate is not exposed to ambient air which might cause premature drying.

Figure 5:
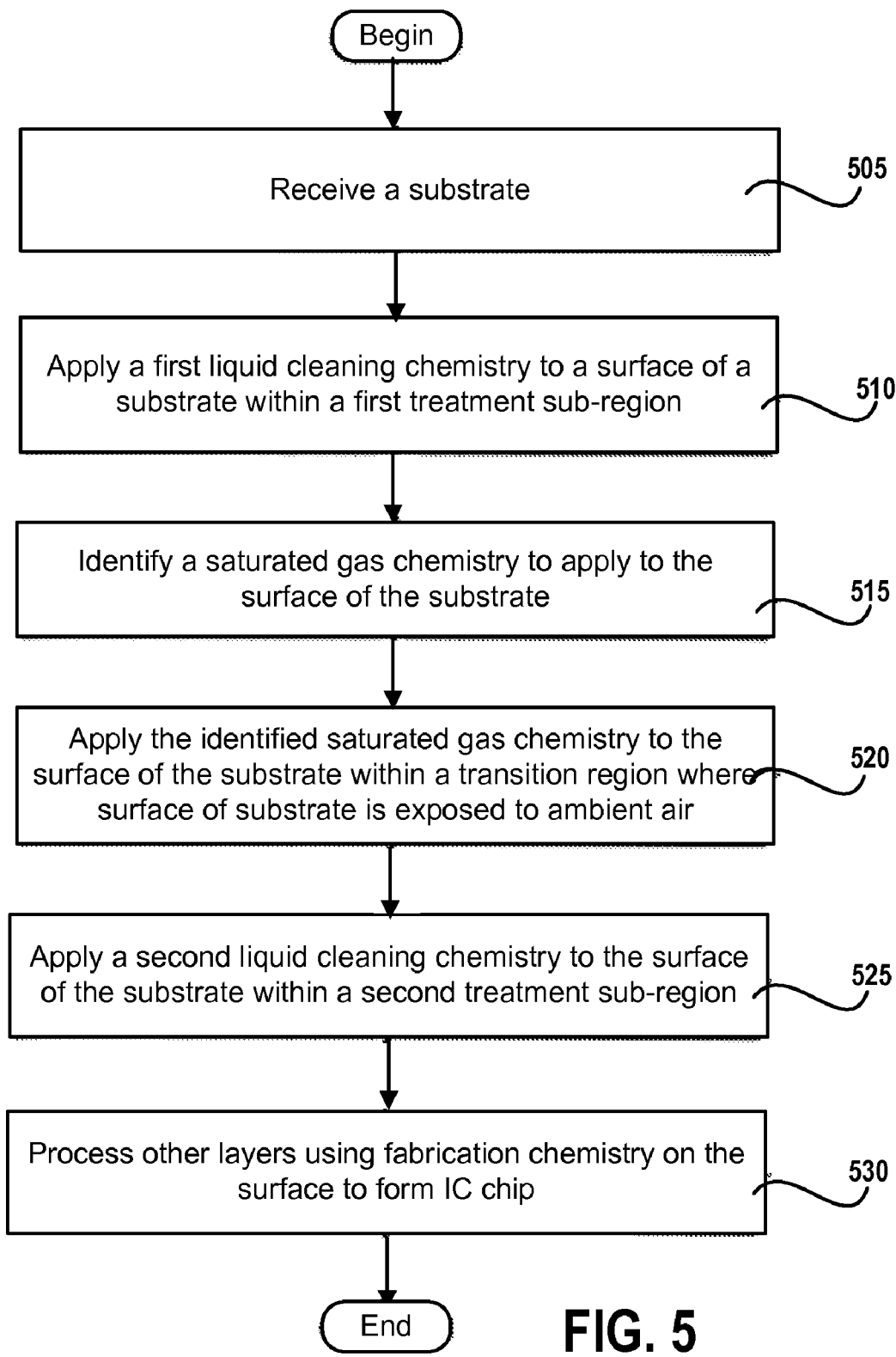
FIG. 5 illustrates a flow chart of operations involved in treating the substrate to saturated gas chemistry, in one embodiment of the invention.

A method for preventing premature drying of a surface of substrate 150 will now be described in detail with reference to FIG. 5. The method begins with receiving a substrate 150 for cleaning, in a housing chamber 100, as shown in operation 505. The substrate 150 received at the housing chamber 100 has already undergone at least one fabrication operation and the surface of the substrate 150 may have residues (including polymer residues and fabrication chemical residues) left behind by the fabrication operation. A first liquid cleaning chemistry is identified and applied to the surface of the substrate 150 when the substrate is in a first treatment sub-region 132 so as to substantially clean the surface of the substrate, as shown in operation 510. The liquid cleaning chemistry may be applied to the surface of the substrate 150 using one of a proximity head system or a brush device system that was described earlier.

In operation 515, a saturated gas chemistry to be applied in a transition region of the housing chamber 100, is identified. The saturated gas chemistry may be an inert gas, such as nitrogen, argon, neon, or a reactive gas, such as oxygen, saturated with de-ionized water. The identified saturated gas chemistry is applied in the transition region 134 of the housing chamber 100 where the substrate may be exposed to the ambient air within the housing chamber 100, as shown in operation 520. The treatment of saturated gas chemistry in the transition region prevents the surface of the substrate 150 from getting exposed to the ambient air thereby preventing premature drying.

The treatment of saturated gas chemistry is followed by a second wet cleaning operation wherein a second liquid cleaning chemistry is applied to the surface of the substrate 150 when the substrate is in the second treatment sub-region 136, as shown in operation 525. The method may conclude with the second wet cleaning treatment or the process may be repeated with additional cleaning operations. It is noted here that after each cleaning operation, the surface of the substrate is treated with saturated gas chemistry in order to avoid exposure of the surface of the substrate to the ambient air. Although, the embodiments of the invention describe application of saturated gas chemistry between two cleaning operations, the teachings of the invention may be extended to apply saturated gas chemistry treatment between a cleaning operation and an ensuing fabrication operation such as etching, chemical mechanical polishing, photolithography, deposition, etc.

The saturated gas chemistry that has shown promising results in preventing premature drying include inert gas such as argon, neon, nitrogen or reactive gas such as oxygen saturated with de-ionized water. The flow-rate of the saturated gas chemistry that has shown promising results is between about 30 standard liters per minute (slm) to about 200 slm. Other parameters of the saturated gas chemistry may include temperature, concentration, exposure time, etc. The temperature of the saturated gas chemistry ranges between about 10° C. to about 80° C. Concentration of saturated gas chemistry that has shown promising results in preventing premature drying is between about 50% to about 100% of saturated gas chemistry vs. DIW, with a mid range between about 70% to about 100% parts of saturated gas chemistry vs. DIW. Exposure time that has shown promising results in preventing premature drying is between about 0.5 second to about 10 seconds with a mid-range of about 1 second to about 5 seconds.

The method continues with operation 530, wherein additional layers and features may be formed on the surface of the substrate to define an integrated circuit chip (IC chip). Some of the additional layers that may be formed include barrier layer, copper film deposit layer to define the metallization interconnects and low-k dielectric film layer, etc. The process may repeat till IC chips are formed on the substrate or some level of fabrication is reached.

Although the embodiments of the invention have been described using a carrier to receive and hold the surface of the substrate 100 using pins/rollers, other types of substrate holding device may be used. In one embodiment, a spin applicator is used to receive and hold the substrate. The spin applicator is mounted within the housing chamber 100. The spin applicator is configured to rotate along an axis so as to expose different portions of the substrate to chemistries applied during the cleaning process.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for preventing premature drying of a surface of a substrate between fabrication operations in a fabrication process, the apparatus comprising:
   a substrate supporting device to receive and support the substrate; and
   a gas chemistry applicator disposed in a transition region of an ambient controlled chamber, the gas chemistry applicator configured to receive and apply a saturated gas chemistry to the surface of the substrate, the applied saturated gas chemistry substantially contained in a transition region, wherein the transition region is defined as a region that is disposed between a first substrate treatment sub-region and a second substrate treatment sub-region within the ambient controlled chamber where the fabrication operations are performed, the application of the saturated gas chemistry providing an isotropic exposure to the surface of the substrate in the transition region such that the surface of the substrate exposed to the saturated gas chemistry in the transition region reduces, the surface of the substrate, from premature drying during transition between the first substrate treatment sub-region and the second substrate treatment sub-region,
   wherein the first substrate treatment sub-region is defined by a first proximity head portion and the second substrate treatment sub-region is defined by a second proximity head portion.

2. The apparatus for preventing premature drying of a surface of a substrate between fabrication operations in a fabrication process as recited in claim 1, wherein the substrate supporting device is a carrier device that moves the substrate along a plane.

3. The apparatus for preventing premature drying of a surface of a substrate between fabrication operations in a fabrication process as recited in claim 1, wherein the gas chemistry applicator includes a nozzle to introduce the saturated gas chemistry to the surface of the substrate, the nozzle having a nozzle-control to control the flow of the saturated gas chemistry into the transition region of the ambient controlled chamber.

4. The apparatus for preventing premature drying of a surface of a substrate between fabrication operations in a fabrication process as recited in claim 1, wherein the first proximity head portion and the second proximity head portion are part of a single proximity head disposed within the ambient controlled chamber, the proximity head configured to apply a plurality of fabrication chemistries during the fabrication operations, the proximity head having distinct controls at the first proximity head portion and the second proximity head portion to control the flow of the plurality of fabrication chemistries applied to the surface of the substrate, the saturated gas chemistry applied between two subsequent fabrication operations.

5. The apparatus for preventing premature drying of a surface of a substrate between fabrication operations in a fabrication process as recited in claim 4, wherein the gas chemistry applicator is integrated into a distinct portion in the proximity head defining the transition region such that the saturated gas chemistry is applied between two subsequent fabrication operations, the proximity head having distinct controls to control the flow of the saturated gas chemistry to the surface of the substrate.

6. An apparatus for preventing premature drying of a surface of a substrate between fabrication operations in a fabrication process as recited in claim 5, wherein the saturated gas chemistry is chosen such that the saturated gas chemistry is substantially immiscible with other fabrication chemistries used.

7. The apparatus for preventing premature drying of a surface of a substrate between fabrication operations in a fabrication process as recited in claim 1, wherein the fabrication operation is a wet cleaning operation and the fabrication chemistry is a liquid cleaning chemistry.

8. An apparatus for preventing premature drying of a surface of a substrate between fabrication operations in a fabrication process as recited in claim 7, wherein the fabrication operations include any one of an etching operation, a repair operation or an additional wet cleaning operation using any one of a fabrication chemistry or another liquid cleaning chemistry.

9. A system for preventing premature drying of a surface of a substrate between fabrication operations in a fabrication process, comprising:
a substrate supporting device to receive and support the substrate in an ambient controlled chamber, the substrate supporting device configured to receive and move the substrate along a plane within the ambient controlled chamber;
a proximity head system disposed within the ambient controlled chamber, the proximity head system having a plurality of proximity heads, the plurality of proximity heads used to apply one or more liquid cleaning chemistry menisci between the surface of the substrate and an opposing surface of the proximity head, such that the liquid cleaning chemistry menisci substantially remove residues and chemicals left behind from other fabrication operations; and
at least one nozzle of a gas chemistry applicator disposed in a transition region of the ambient controlled chamber to introduce a saturated gas chemistry, the transition region defined as a region disposed between a first substrate treatment sub-region and a second substrate treatment sub-region within the ambient controlled chamber where the fabrication operations are performed, the saturated gas chemistry substantially contained within the transition region to provide an isotropic exposure to the surface of the substrate such that the surface of the substrate exposed to the saturated gas chemistry in the transition region reduces the surface of the substrate from premature drying during transition between the first substrate treatment sub-region and the second substrate treatment sub-region, the nozzle including a nozzle-control to control the flow of the saturated gas chemistry into the transition region in the ambient controlled chamber.

10. The system of claim 9, wherein each of the plurality of proximity heads includes an inlet-control to control the flow of the liquid cleaning chemistries to the surface of the substrate so as to substantially maintain a liquid cleaning chemistry meniscus over the surface of the substrate.

11. The system of claim 10, wherein the inlet-control and nozzle-control are communicatively connected to a computing system, the computing system providing the control recipe that controls the flow of the liquid cleaning chemistries and the saturated gas chemistry into the ambient controlled chamber.

12. A system for preventing premature drying of a surface of a substrate between fabrication operations in a fabrication process, comprising:
a substrate supporting device to receive and support the substrate in an ambient controlled chamber, the substrate supporting device configured to receive and move the substrate along a plane and to rotate the substrate along an axis of rotation within the ambient controlled chamber;
a brush device system disposed within the ambient controlled chamber, the brush device system including a brush configured to receive and apply a liquid cleaning chemistry to the surface of the substrate, such that the liquid cleaning chemistry substantially removes residues and chemicals left behind from other fabrication operations; and
at least one nozzle of a gas chemistry applicator disposed in a transition region of the ambient controlled chamber to introduce a saturated gas chemistry, the transition region defined as a region disposed between a first substrate treatment sub-region and a second substrate treatment sub-region within the ambient controlled chamber where the fabrication operations are performed, the saturated gas chemistry substantially contained within the transition region in the ambient controlled chamber so as to provide an isotropic exposure to the surface of the substrate such that the surface of the substrate exposed to the saturated gas chemistry in the transition region reduces the surface of the substrate from premature drying during transition between the first substrate treatment sub-region and the second substrate treatment sub-region,
wherein the nozzle includes a nozzle-control to control the flow of the saturated gas chemistry into the transition region in the ambient controlled chamber and the substrate supporting device and the brush device system are configured to move the substrate and the brush relative to each other such that the surface of the substrate is substantially exposed to the saturated gas chemistry in the transition region.

13. The system of claim 12, wherein the brush includes an inlet to receive a first liquid cleaning chemistry, the flow of the first liquid cleaning chemistry into the brush controlled by an inlet-control.

14. The system of claim 13, wherein the inlet-control and nozzle-control are communicatively connected to a computing system, the computing system providing the control recipe that controls the flow of the liquid cleaning chemistry and the saturated gas chemistry into the ambient controlled chamber.

15. The system of claim 13, wherein the inlet of the brush is further configured to receive and apply a second liquid cleaning chemistry to the surface of the substrate and wherein the inlet-control is configured to control the flow of the second liquid cleaning chemistry and to switch from the first liquid cleaning chemistry to the second liquid cleaning chemistry.

16. The system of claim 13, wherein the brush device system further comprising a second brush configured to receive and apply a second liquid cleaning chemistry to the surface of the substrate through a second inlet having a second inlet-control, the second inlet-control configured to control the flow of the second liquid cleaning chemistry, such that the second liquid cleaning chemistry substantially removes residues and chemicals left behind from other fabrication operations.

17. An apparatus for preventing premature drying of a surface of a substrate between fabrication operations in a fabrication process, the apparatus comprising:
a carrier for supporting the substrate; and
a gas chemistry applicator directed toward a transition region of an ambient controlled chamber to apply a saturated gas chemistry to the surface of the substrate when present, wherein the transition region is disposed between a first substrate treatment sub-region and a second substrate treatment sub-region within the ambient controlled chamber, the application of the saturated gas chemistry providing an isotropic exposure to the surface of the substrate in the transition region such that the surface of the substrate, when present in the transition region reduces premature drying during transition between the first substrate treatment sub-region and the second substrate treatment sub-region, wherein the first substrate treatment sub-region is defined by a first proximity head and the second substrate treatment sub-region is defined by a second proximity head.

18. The apparatus of claim 17, wherein the first proximity head and the second proximity head have distinct controls to control flow of plurality of fabrication chemistries applied to the surface of the substrate, the saturated gas chemistry applied between two subsequent fabrication operations.

* * * * *